(12) United States Patent
Sakai et al.

(10) Patent No.: US 11,307,337 B2
(45) Date of Patent: Apr. 19, 2022

(54) DISPLAY DEVICE AND METHOD FOR MANUFACTURING DISPLAY DEVICE

(71) Applicant: SHARP KABUSHIKI KAISHA, Sakai (JP)

(72) Inventors: Akira Sakai, Sakai (JP); Masahiro Hasegawa, Sakai (JP); Atsushi Ban, Sakai (JP); Koji Murata, Sakai (JP); Yuichi Kawahira, Sakai (JP); Kiyoshi Minoura, Sakai (JP); Takako Koide, Sakai (JP); Kozo Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/499,238

(22) PCT Filed: Mar. 23, 2018

(86) PCT No.: PCT/JP2018/011562
§ 371 (c)(1),
(2) Date: Sep. 27, 2019

(87) PCT Pub. No.: WO2018/180938
PCT Pub. Date: Oct. 4, 2018

(65) Prior Publication Data
US 2021/0109269 A1 Apr. 15, 2021

(30) Foreign Application Priority Data

Mar. 30, 2017 (JP) .............................. JP2017-068003

(51) Int. Cl.
*G02B 5/30* (2006.01)
*G02F 1/1335* (2006.01)
(Continued)

(52) U.S. Cl.
CPC ..... *G02B 5/3016* (2013.01); *G02F 1/133541* (2021.01); *G06F 3/041* (2013.01); *H01L 27/323* (2013.01); *H01L 51/5262* (2013.01)

(58) Field of Classification Search
CPC .................. G02B 5/3016; G02F 1/133541
See application file for complete search history.

(56) References Cited

U.S. PATENT DOCUMENTS

| 2006/0055845 A1* | 3/2006 | Hisatake ........... G02F 1/133634 349/98 |
| 2008/0048558 A1* | 2/2008 | Song ................... H01L 51/5281 313/504 |

(Continued)

FOREIGN PATENT DOCUMENTS

| CN | 109804303 A | * 5/2019 | ......... G02F 1/13363 |
| JP | H10-048625 A | 2/1998 | |

(Continued)

*Primary Examiner* — Donald L Raleigh
(74) *Attorney, Agent, or Firm* — ScienBiziP, P.C.

(57) ABSTRACT

The present invention provides: (I) a display device including a display panel, a retardation layer, and a polarizer which are stacked in the stated order from a back surface side to a viewing surface side and integrated without an adhesive layer; and (II) a method for producing a display device including: forming a first alignment film on a display panel, applying a solution containing first polymerizable liquid crystal to the first alignment film, and curing the first polymerizable liquid crystal to produce a retardation layer; and forming a second alignment film on the retardation layer, applying a solution containing second polymerizable liquid crystal and a dichroic material to the second alignment film, and curing the second polymerizable liquid crystal to produce a polarizer.

14 Claims, 4 Drawing Sheets

(51) Int. Cl.
*G06F 3/041* (2006.01)
*H01L 27/32* (2006.01)
*H01L 51/52* (2006.01)

(56) References Cited

U.S. PATENT DOCUMENTS

| | | | |
|---|---|---|---|
| 2016/0062510 A1 | 3/2016 | Tomohisa et al. | |
| 2017/0075171 A1 | 3/2017 | Lee et al. | |
| 2017/0187004 A1* | 6/2017 | Giraldo | H01L 51/5253 |
| 2018/0143363 A1* | 5/2018 | Ichihashi | C09K 19/36 |

FOREIGN PATENT DOCUMENTS

| | | | | |
|---|---|---|---|---|
| JP | 2007-322777 A | | 12/2007 | |
| JP | 2014-102440 A | | 6/2014 | |
| JP | 2014-219667 A | | 11/2014 | |
| JP | WO-2017006787 A1 | * | 1/2017 | ......... G02F 1/13363 |
| JP | 2017-058659 A | | 3/2017 | |
| KR | 20170092737 A | * | 8/2017 | ............. H01L 51/56 |
| WO | 2016/016156 A1 | | 2/2016 | |
| WO | 2017/006787 A1 | | 1/2017 | |
| WO | WO-2017006787 A1 | * | 1/2017 | ....... G02F 1/133536 |

\* cited by examiner

DISPLAY DEVICE AND METHOD FOR MANUFACTURING DISPLAY DEVICE

TECHNICAL FIELD

The present invention relates to display devices and methods for producing a display device. The present invention specifically relates to display devices such as an organic electroluminescent display device and a liquid crystal display device and a method for producing a display device.

BACKGROUND ART

Recently, display devices typified by organic electroluminescent display devices (OLEDs) and liquid crystal display devices (LCDs) have been desired to have flexibility in order to serve as curved displays whose display surface is curved or foldable displays which can be folded. In particular, organic electroluminescent display devices have been expected to have flexibility because they do not require members such as a backlight and thus have an advantageous structure for achieving a thin profile.

A typical display device is provided with a polarizing plate on the outside of a display panel in order to ensure the display quality and design ability. For example, an organic electroluminescent display device is provided with a circularly polarizing plate, a kind of polarizing plates. This is a countermeasure for a very large amount of internal reflection of the display panel in the display device in the case of using a metal material for a cathode. The term "polarizing plate" means a laminate including members such as a polarizer that has a polarizing function, a protective film that protects the polarizer, a retarder that improves the properties of a display, and a pressure-sensitive adhesive that integrates these members.

In a conventional commercial system, a polarizing plate manufacturer produces a polarizing plate, and a display panel manufacturer bonds the polarizing plates to a display panel. Thus, members constituting a polarizing plate need to be integrated using a pressure-sensitive adhesive or adhesive before being bonded to a display panel. Even when a pressure-sensitive adhesive or adhesive is not used for stacking a polarizer and a retarder, a pressure-sensitive adhesive or adhesive is still needed for bonding the polarizing plate to the display panel. Accordingly, a pressure-sensitive adhesive or adhesive is commonly considered essential for production of a polarizing plate in the technical field.

Polarizing plate manufacturers want to handle such a polarizing plate in the form of long rolls before cutting it into an ordered size in terms of economic efficiency. Generally, it is difficult to handle a film having a thickness of smaller than 30 µm in the form of long rolls: the film may be broken or have wrinkles during winding up. Accordingly, a protective film is commonly considered essential in the technical field even in production of a thin profile polarizer or retarder because the protective film functions as a support of the polarizer or retarder to contribute to better handleability.

As described, conventional polarizing plates, which include members each having a thickness of several micrometers to several tens of micrometers, are limited in reducing the thickness and thus are unsuitable for having flexibility. In particular, conventional circularly polarizing plates, which include more members than linearly polarizing plates and tend to be thicker, have more difficulty in having flexibility. Furthermore, issues given by polarizing plates, such as insufficient durability and high costs for production, are desired to be overcome. For example, a polarizing plate includes an adhesive layer that tends to cause troubles such as white turbidity during a bending test or a moisture resistance test.

Examples of a conventional thin profile polarizing plate include an elliptically polarizing plate disclosed in Patent Literature 1. The elliptically polarizing plate of Patent Literature 1 includes a transmissive protective film, a polarizer, and an anisotropic optical element including a nematic liquid crystal layer stacked in the stated order. In the nematic liquid crystal layer, molecules of at least a positive uniaxial liquid crystal composition in a liquid crystal state are brought into a nematic alignment and the alignment is fixed.

CITATION LIST

Patent Literature
Patent Literature 1: JP 2007-322777 A

SUMMARY OF INVENTION

Technical Problem

The elliptically polarizing plate disclosed in Patent Literature 1 achieves some effects of a thin profile by using an anisotropic optical element containing a nematic liquid crystal layer and eliminating one of two protective films. Unfortunately, the elliptically polarizing plate still includes the other protective film and an adhesive for bonding the polarizing plate to a display panel. Thus, such a polarizing plate is desired to have a further thinner profile to have flexibility.

The present invention has been made under the current situation in the art and aims to provide a display device having a thin profile and excellent flexibility and durability, and a method for producing a display device suitable for production of the display device.

Solution to Problem

The inventors made various studies for achieving a display device having a thin profile and excellent flexibility and durability and focused on elimination of an adhesive layer used for disposing a retardation layer or polarizing layer on the viewer side of the display device. The inventors thereby found that elimination of the adhesive layer cannot only reduce the thickness of the display device but also improve the flexibility and durability to achieve a foldable display device. Thereby, the inventors successfully overcame the above issues, arriving at the present invention.

In other words, an aspect of the present invention is a display device including a display panel, a retardation layer, and a polarizer which are stacked in the stated order from a back surface side to a viewing surface side and integrated without an adhesive layer.

Another aspect of the present invention is a method for producing a display device including: forming a first alignment film on a display panel, applying a solution containing first polymerizable liquid crystal to the first alignment film, and curing the first polymerizable liquid crystal to produce a retardation layer; and forming a second alignment film on the retardation layer, applying a solution containing second polymerizable liquid crystal and a dichroic material to the second alignment film, and curing the second polymerizable liquid crystal to produce a polarizer.

Advantageous Effects of Invention

The present invention achieves a display device having a thin profile and excellent flexibility and durability.

DESCRIPTION OF EMBODIMENTS

Hereinafter, the present invention is described in more detail based on an embodiment with reference to the drawings. The embodiment, however, is not intended to limit the scope of the present invention. The configurations of the embodiment may appropriately be combined or modified within the spirit of the present invention.

Herein, the "viewing surface side" means the side closer to the screen (display surface) of the display device. The "back surface side" means the side farther from the screen (display surface) of the display device.

The "retardation layer" as used herein means a retardation layer providing an in-plane retardation of 10 nm or more to at least light having a wavelength of 550 nm. Light having a wavelength of 550 nm is light of a wavelength at which a human has the highest visual sensitivity. The in-plane retardation is defined as $R=(n_s-n_f) \times d$, where $n_s$ represents the in-plane principal refractive index $n_x$ or $n_y$ of the retardation layer, whichever is greater, $n_f$ represents the in-plane principal refractive index $n_x$ or $n_y$ of the retardation layer, whichever is smaller, and d represents the thickness of the retardation layer. The principle refractive indexes are values for light having a wavelength of 550 nm, unless otherwise stated. The in-plane slow axis of a retardation layer means an axis extending in the direction corresponding to $n_s$, and the in-plane fast axis thereof means an axis extending in the direction corresponding to $n_f$. The "retardation" as used herein means the in-plane retardation to light having a wavelength of 550 nm, unless otherwise stated.

Embodiment 1

Figure 1:
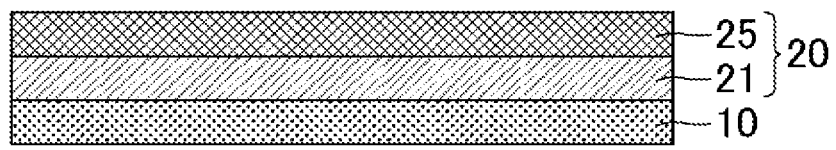
FIG. 1 is a schematic cross-sectional view showing the structure of a circularly polarizing plate included in an organic electroluminescent display device of Embodiment 1 (Example 1).

FIG. 1 is a schematic cross-sectional view showing the structure of a circularly polarizing plate included in an organic electroluminescent display device of Embodiment 1. As shown in FIG. 1, the organic electroluminescent display device of Embodiment 1 includes an organic electroluminescent panel (display panel) 10, a coating λ/4 retardation layer (λ/4 plate) 21 having reverse wavelength dispersibility, and a coating polarizing layer (polarizer) 25, which are stacked in the stated order from the back surface side to the viewing surface side and integrated without an adhesive layer. The "adhesive layer" herein means a layer that contains one or both of a pressure-sensitive adhesive having an adhesive function and an adhesive having a bonding function.

The coating λ/4 retardation layer 21 preferably includes, in the order from the back surface side to the viewing surface side, an alignment film undergone alignment treatment at a specific azimuth and a layer (hereinafter, also referred to as "reactive mesogen layer") containing a cured product of polymerizable liquid crystal.

The alignment film may be a typical one in the field of liquid crystal display panels, such as a polyimide film. The alignment film may be formed by applying a solution to an organic electroluminescent panel 10 and curing the solution by baking, light application, or the like. Examples of the alignment treatment for the alignment film include rubbing and light application. The surface for the solution application of the organic electroluminescent panel 10 may have undergone surface treatment such as plasma surface treatment.

The reactive mesogen layer may be formed by applying polymerizable liquid crystal to the alignment film undergone alignment treatment and curing the polymerizable liquid crystal by baking, light application, or the like. Molecules of the cured polymerizable liquid crystal align along the alignment azimuth of the alignment film, which has been given by the alignment treatment, to cause retardation. The retardation of the reactive mesogen layer is determined by a product of the birefringence Δn of the polymerizable liquid crystal and the thickness d of the reactive mesogen layer.

The polymerizable liquid crystal preferably contains liquid crystal molecules containing a photoreactive group. Examples of the liquid crystal molecules containing a photoreactive group include a polymer or oligomer (hereinafter, also simply referred to as "polymer") having a side chain including both a substituent (mesogen group) such as a biphenyl group, a terphenyl group, a naphthalene group, a phenylbenzoate group, an azobenzene group, or a derivative thereof and a photoreactive group such as a cinnamoyl group, a chalcone group, a cinnamylidene group, a β-(2-phenyl) acryloyl group, a cinnamic acid group, or a derivative thereof, and a main chain derived from an acrylate, a methacrylate, maleimide, N-phenylmaleimide, or a siloxane. The polymer may be a homopolymer containing only a single type of repeat unit, or may be a copolymer containing two or more types of repeat units with different side chain structures. The copolymer includes copolymers such as alternating copolymers, random copolymers, and graft copolymers. In each copolymer, a side chain of at least one repeat unit has a mesogen group and a photoreactive group such as those described above together, but a side chain of another repeat unit may contain no mesogen group or no photoreactive group.

Examples of the solvent used for application of the polymerizable liquid crystal include toluene, ethylbenzene, ethylene glycol monomethyl ether, ethylene glycol dimethyl ether, propylene glycol methyl ether, dibutyl ether, acetone, methyl ethyl ketone, ethanol, propanol, cyclohexane, cyclopentanone, methylcyclohexane, tetrahydrofuran, dioxane, cyclohexanone, n-hexane, ethyl acetate, butyl acetate, propylene glycol methyl ether acetate, methoxybutyl acetate, N-methylpyrrolidone, and dimethylacetamide. These may be used alone or in combination with each other.

The coating $\lambda/4$ retardation layer 21 is preferably the one that provides an in-plane retardation of ¼ wavelength to at least light having a wavelength of 550 nm, specifically, an in-plane retardation of 100 nm or more and 176 nm or less.

The coating polarizing layer 25 preferably includes, in the following order from the back surface side to the viewing surface side, an alignment film undergone alignment treatment at a specific azimuth and a reactive mesogen layer containing a polarizing material, such as a dichroic dye, whose molecules align at a specific azimuth. The alignment film in the coating polarizing layer 25 may be formed in the same manner as for the alignment film in the coating $\lambda/4$ retardation layer 21.

The reactive mesogen layer in the coating polarizing layer 25 may be formed in the same manner as for the reactive mesogen layer in the coating $\lambda/4$ retardation layer 21 except for allowing the reactive mesogen layer to contain a polarizing dichroic material such as a dichroic dye.

The combination of the coating polarizing layer 25 and the coating $\lambda/4$ retardation layer 21 functions as a circularly polarizing plate. This can reduce internal reflection of the display panel to provide good black display with reduced reflection (glare) of natural light. Thereby, the visibility of displayed images is significantly improved particularly in outdoor use.

The organic electroluminescent display device of Embodiment 1 may include other member (s), such as a touch screen sensor. The touch screen sensor may be disposed closer to the viewing surface than the coating polarizing layer 25 is, closer to the back surface than the coating $\lambda/4$ retardation layer 21 is, or inside the organic electroluminescent panel 10. Disposing the touch screen sensor closer to the back surface than the coating $\lambda/4$ retardation layer 21 is can reduce reflection of natural light in the touch screen sensor.

The coating polarizing layer 25 may be provided with a cover on the viewing surface side via an optically clear adhesive (OCA) sheet. The cover preferably has a transparent display region. The region(s) other than the display region may have a design such as color or pattern.

The coating polarizing layer 25 may have an antireflection film on the viewing surface side. This structure can reduce reflection of natural light to further reduce glare of natural light on the display surface of the display device. Suitable examples of the antireflection film include antireflection (AR) films and low reflection (LR) films, both of which are films based on the theory of thin film interference, and moth-eye films having a surface structure like a moth's eye.

As mentioned above, in Embodiment 1, the display device can have a thin profile because a retardation layer and a polarizer are directly stacked on a display panel in the stated order by coating (application) without an adhesive layer. In coating, the display panel works as a support, which eliminates the need for using a protective film required by conventional cases. Elimination of an adhesive layer and a reduced thickness of the circularly polarizing plate part can improve the flexibility and durability.

Other Embodiments

Embodiment 1 exemplifies an organic electroluminescent display device including the organic electroluminescence 10 as a display panel. Alternatively, the display device of the present invention may be a liquid crystal display device that employs a liquid crystal panel as a display panel and includes the coating $\lambda/4$ retardation layer 21 and the coating polarizing layer 25 stacked on the liquid crystal panel.

In Embodiment 1, the organic electroluminescent panel 10, the coating $\lambda/4$ retardation layer 21, and the coating polarizing layer 25 are stacked in the stated order and integrated without an adhesive layer. The display device of the present invention may have a structure in which a display panel, a retardation layer, and a polarizer are stacked in the stated order and integrated without an adhesive layer. For example, multiple retardation layers may be disposed between the display panel and the polarizer, or other optical member(s) may be disposed in addition to the display panel, the retardation layer, and the polarizer. The display device of the present invention, in which members disposed between a display panel and a polarizer are stacked and integrated without an adhesive layer, is distinguished from a display device in which an adhesive layer is disposed between a display panel and a polarizer and a display device in which members between a display panel and a polarizer are simply stacked and not integrated, for example.

The present invention is described in more detail with reference to examples and comparative examples below, but the present invention is not limited to these examples.

Example 1

Figure 2:
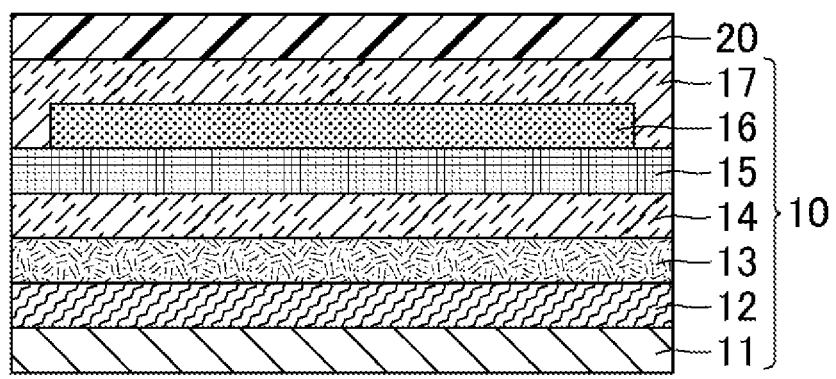
FIG. 2 is a schematic cross-sectional view showing the structure of an organic electroluminescent display panel included in the organic electroluminescent display device of Example 1.

In Example 1, a display device of Embodiment 1 was actually produced by the following method. FIG. 2 is a schematic cross-sectional view showing the structure of an organic electroluminescent display panel included in the organic electroluminescent display device of Example 1. Hereinafter, the method for producing the organic electroluminescent display device of Example 1 is described with reference to FIGS. 1 and 2.

(1) Production of Organic Electroluminescent Panel (OLED)

A molybdenum (Mo) film 12 as a heat absorption layer was formed on a glass substrate 11 as a support substrate by sputtering. In order to improve the wettability and adhesion of the Mo film 12, the Mo film 12 was coated with a silane coupling agent by spin coating. The resulting Mo film 12 was coated with a precursor of polyimide by slit coating and the coating was baked at a baking temperature of 400° C., whereby a polyimide film 13 was formed. On the polyimide film 13, a silicon oxynitride (SiON) film and a silicon nitride (SiNx) film were sequentially stacked by plasma CVD, whereby a protective film 14 was formed. On the protective film 14, an aluminum (Al) film as an anode, thin film transistors (TFTs), and wiring were formed, whereby a TFT layer 15 was formed. Thereby, a TFT substrate was obtained.

On the resulting TFT substrate, a hole injection layer, a hole transport layer, a light emitting layer, an electron transport layer, an electron injection layer, and an ITO film as a cathode were sequentially stacked to form an organic electroluminescent layer 16. By plasma CVD, a silicon nitride (SiNx) film and a silicon oxynitride (SiON) film were sequentially stacked so as to cover the organic electroluminescent layer 16, whereby a sealing film 17 was formed. Thereby, the organic electroluminescent panel 10 was obtained.

(2) Production of Organic Electroluminescent Panel with Polarizing Plate

On the resulting organic electroluminescent panel 10, the coating λ/4 retardation layer 21 having reverse wavelength dispersibility was directly stacked by the following method.

[Production of Coating λ/4 Retardation Layer 21]

First, the following materials were added to a solvent mixture containing methyl ethyl ketone (MEK) and methyl isobutyl ketone (MIBK) at a weight ratio of 10:1 such that the solid concentration was 20%, whereby an alignment film solution was prepared.

a thickness of 100 nm was formed. The alignment film was rubbed at an azimuth of 0° and thereby underwent alignment treatment.

The following materials were mixed with a solvent containing cyclopentanone and N-methyl-2-pyrrolidone (NMP) at a weight ratio of 6:4 such that the concentration was 17% by weight, whereby polymerizable liquid crystal solution A was prepared.

(Materials of Polymerizable Liquid Crystal Solution A)

Polymerizable liquid crystal represented by the following formula (1): 12.31 parts by weight Polymerizable liquid crystal represented by the following formula (2): 0.86 parts by weight Polymerization initiator "Irgacure 369" (from BASF): 0.73 parts by weight Leveling agent "BYK-361N" (from BYK-Chemie): 0.01 parts by weight

[Chem. 1]

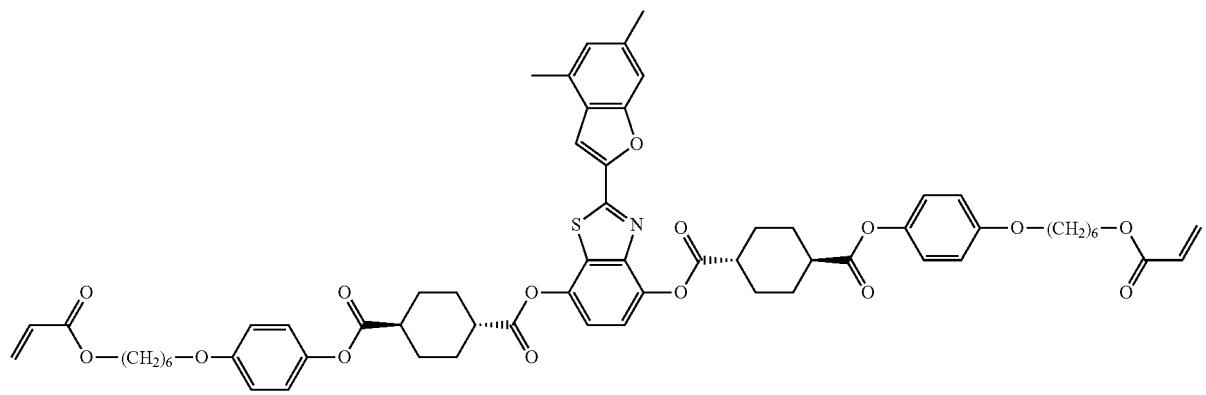

(1)

[Chem. 2]

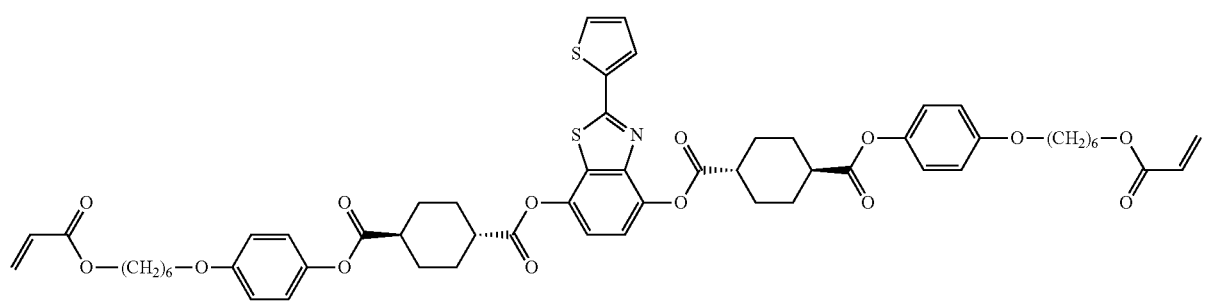

(2)

(Materials of Alignment Film Solution)

Urethane (meth)acrylate oligomer "UV1700B" (from the Nippon Synthetic Chemical Industry Co., Ltd.): 50 parts by weight Pentaerythritol triacrylate (PETA) "Light acrylate PE-3A" (from Kyoeisha Chemical Co., Ltd.): 50 parts by weight Photopolymerization initiator "Lucillin TPO" (from BASF): 4 parts by weight The prepared alignment film solution was applied to the organic electroluminescent panel 10 by flexographic printing, dried in an oven at 80° C. for one minute, and irradiated with UV light to be cured, whereby an alignment film having The prepared polymerizable liquid crystal solution A was applied to an alignment film undergone alignment treatment by slit coating, dried for one minute in an oven at 120° C., and irradiated with UV light with a high-pressure mercury lamp at a dose of 400 mJ/cm$^2$, whereby the coating λ/4 retardation layer 21 was produced. The resulting coating λ/4 retardation layer 21 was measured for wavelength dispersibility with AxoScan (from Axometrics), and was found to have reverse wavelength dispersibility.

On the resulting coating λ/4 retardation layer 21, the coating polarizing layer 25 was directly stacked.

[Production of Coating Polarizing Layer 25]

The same alignment film solution as used in production of the coating λ/4 retardation layer 21 was applied to the coating λ/4 retardation layer 21 by flexographic printing, dried for one minute in an oven at 80° C., and irradiated with UV light to be cured, whereby an alignment film having a thickness of 100 nm was formed. The alignment film was rubbed at an azimuth of 45° and thereby underwent alignment treatment.

Then, polymerizable liquid crystal solution B prepared by mixing the following materials was applied thereto by slit coating, dried for one minute in an oven at 120° C., and irradiated with UV light with a high-pressure mercury lamp at a dose of 400 mJ/cm$^2$, whereby the coating polarizing layer 25 was produced.

(Materials of Polymerizable Liquid Crystal Solution B)

Polymerizable liquid crystal solution "RMS03-013" (from Merck): 100 parts by weight Dichroic dye "NKX 2029" (from Hayashibara Co., Ltd.): 2 parts by weight These processes provided a circularly polarizing plate 20 that was a laminate including the coating λ/4 retardation layer 21 and the coating polarizing layer 25. The resulting circularly polarizing plate 20 of Example 1 had a thickness of 5 μm.

Finally, the organic electroluminescent panel 10 was irradiated with laser light from the glass substrate 11 side, so that the adhesion between the Mo film 12 and the polyimide layer 13 was reduced. The glass substrate 11 and the Mo film 12 were then separated from the other members of the organic electroluminescent panel 10, whereby the flexible organic electroluminescent panel with a polarizing plate of Example 1 was produced.

In the present example, in order to obtain an organic electroluminescent panel having excellent flexibility, the molybdenum (Mo) film 12 and the polyimide film 13 were formed on the glass substrate 11, which functioned as a support substrate during production of the panel, and the glass substrate 11 and the Mo film 12 were separated at the end of the panel production, whereby the polyimide film 13 functioned as a support substrate of the final product. Alternatively, the glass substrate may be used as a support substrate of the final product.

Example 2

Figure 3:
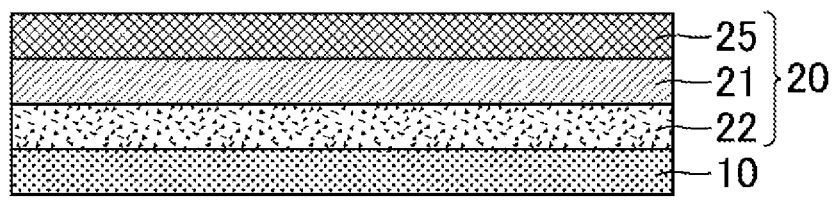
FIG. 3 is a schematic cross-sectional view showing the structure of a circularly polarizing plate included in an organic electroluminescent display device of Example 2.

FIG. 3 is a schematic cross-sectional view showing the structure of a circularly polarizing plate included in an organic electroluminescent display device of Example 2. Hereinafter, the method for producing the organic electroluminescent display device of Example 2 is described with reference to FIG. 3.

On the organic electroluminescent panel 10 produced in the same manner as in Example 1, a coating positive C plate 22 was directly stacked by the following method.

[Production of Coating Positive C Plate 22]

The following materials were mixed with a solvent containing N-methyl-2-pyrrolidone and butyl cellosolve at a weight ratio of 7:3, whereby a vertical alignment film solution was prepared.

(Materials of Vertical Alignment Film Solution)

Copolymer prepared by mixing 16.6 parts by weight of styrene, 16.6 parts by weight of methyl methacrylate, and 16.6 parts by weight of cyclohexane maleimide: 50 parts by weight 1,6-hexanediol diacrylate (HDDA): 50 parts by weight The resulting vertical alignment film solution was applied to the organic electroluminescent panel 10 by flexographic printing so as to have a thickness of 100 nm, and dried for one minute in an oven at 80° C., whereby a vertical alignment film was formed. To the resulting vertical alignment film, a polymerizable liquid crystal solution "RMM 28B" (from Merck) was applied by slit coating so as to have a thickness of 4 μm, dried for five minutes in an oven at 65° C., and irradiated with UV light with a high-pressure mercury lamp at a dose of 400 mJ/cm$^2$, whereby a coating positive C plate 22 was produced. The resulting coating positive C plate 22 had a thickness retardation (Rth) of 97 nm.

On the coating positive C plate 22, the coating λ/4 retardation layer 21 having reverse wavelength dispersibility and the coating polarizing layer 25 were directly stacked in the stated order in the same manner as in Example 1.

These processes provided a circularly polarizing plate 20 that was a laminate including the coating positive C plate 22, the coating λ/4 retardation layer 21, and the coating polarizing layer 25. The resulting circularly polarizing plate 20 of Example 2 had a thickness of 9 μm.

Finally, the organic electroluminescent panel 10 was irradiated with laser light from the glass substrate 11 side, so that the adhesion between the Mo film 12 and the polyimide layer 13 was reduced. The glass substrate 11 and the Mo film 12 were then separated from the other members of the organic electroluminescent panel 10, whereby the organic electroluminescent panel with a polarizing plate of Example 2 was produced.

Example 3

Figure 4:
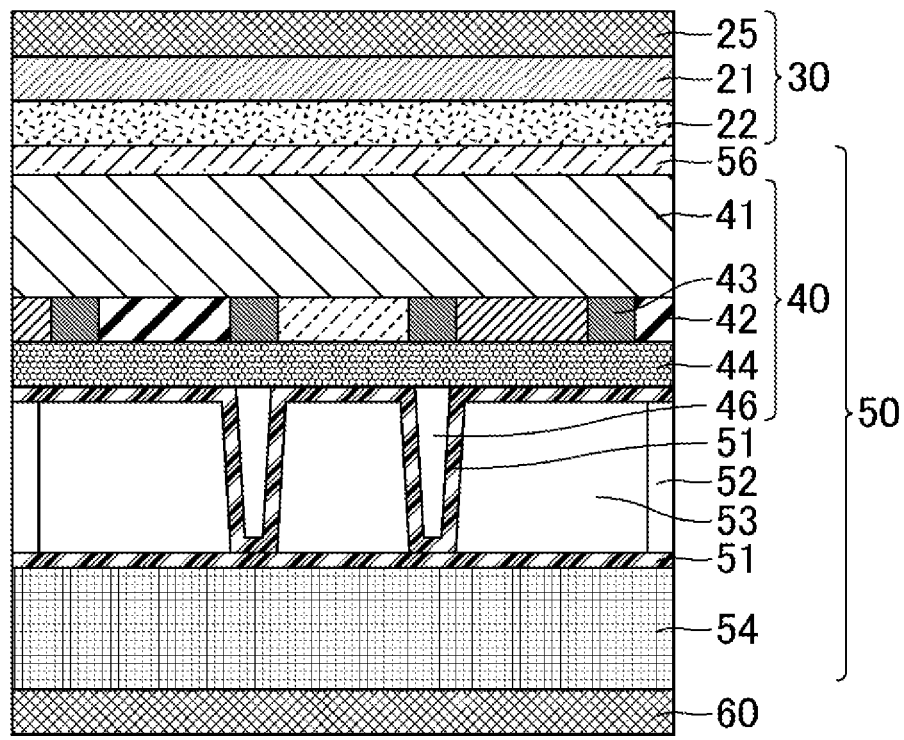
FIG. 4 is a schematic cross-sectional view showing the structure of a liquid crystal display device of Example 3.

FIG. 4 is a schematic cross-sectional view showing the structure of a liquid crystal display device of Example 3. Hereinafter, the method for producing the liquid crystal display device of Example 3 is described with reference to FIG. 4.

(1) Production of Liquid Crystal Panel (LCD)

On a glass substrate 41 was placed a substrate including a red, green, and blue (RGB) color filter (CF) layer 42 and a black matrix (BM) 43. In order to level the surfaces of the CF layer 42 and BM 43, an over coat (OC) layer 44 formed from heat curable resin was stacked thereon. Then, photo spacers (PSs) 46 formed from resist (photosensitive resin) and having a height of 3.3 μm were formed thereon, so that a liquid crystal layer 53 had a thickness of 3.3 μm. Thereby, a color filter (CF) substrate 40 was obtained.

On the CF substrate 40, a film of a polyimide-based material was formed by flexographic printing so as to have a thickness of 100 nm. The film underwent rubbing treatment so that liquid crystal molecules had an alignment azimuth of 0°, whereby an alignment film 51 was formed. Then, a TFT substrate 54 having members such as TFTs and pixel electrodes was prepared. On the TFT substrate 54, the alignment film 51 was also formed under the same conditions as for the formation of the alignment film on the CF substrate 40.

To the outer edge of the CF substrate 40 covered with the alignment film 51, a heat curable sealant was applied in a pattern with a drawing device. The CF substrate 40 and the TFT substrate 54 were then bonded together. The workpiece was baked in an oven at 140° C. for one hour, so that the heat curable sealant was cured. These processes provided an empty liquid crystal panel in which the CF substrate 40 and the TFT substrate 54 were bonded together with a seal 52 at their outer edges to provide a cavity in the center.

Into the resulting empty liquid crystal panel, a negative liquid crystal material ($\Delta\varepsilon=-4.0$, $\Delta n=0.095$) having a negative anisotropy of dielectric constant $\Delta\varepsilon$ was injected by the vacuum injection method, whereby a liquid crystal layer 53 was produced. The thickness of the liquid crystal layer 53 was controlled to be 3.3 μm by the photo spacers 46 as mentioned above.

The resulting liquid crystal panel underwent slimming treatment such that the CF substrate 40 and the TFT substrate 54 each had a thickness of 0.15 mm. On the viewing surface side of the CF substrate 40, an ITO thin film 56 was formed by sputtering, which is used for prevention of alignment disorder caused by electrification or fora touchscreen sensor. Thereby, a liquid crystal panel 50 was obtained.

(2) Stacking of Retardation Layer and Polarizing Film

On the viewing surface side of the liquid crystal panel 50 were directly stacked the coating positive C plate 22, the coating λ/4 retardation layer 21, and the coating polarizing layer 25 in the stated order in the same manner as in Example 2. Differently from Example 2, the rubbing azimuth of the alignment film on the coating λ/4 retardation layer 21 was 0°, and the rubbing azimuth of the alignment film on the coating polarizing layer 25 was 90°. These processes provided on the viewing surface side of the liquid crystal panel 50 a linearly polarizing plate 30 that was a laminate including the coating positive C plate 22, the coating λ/4 retardation layer 21, and the coating polarizing layer 25. On the back surface side of the liquid crystal panel 50, a coating polarizing layer 60 was directly stacked in the same manner as in Example 1. The rubbing azimuth of the alignment film on the coating polarizing layer 60 was 0°.

On the back surface side of the coating polarizing layer 60 was stacked a brightness enhancement film "APF-V3" (from 3M Japan Ltd.) using an adhesive layer "PD-S1" (from Panac Co., Ltd.). Finally, a backlight was disposed on the back surface side of the liquid crystal panel 50. Thereby, the liquid crystal display device of Example 3 was obtained.

Example 4

Figure 5:
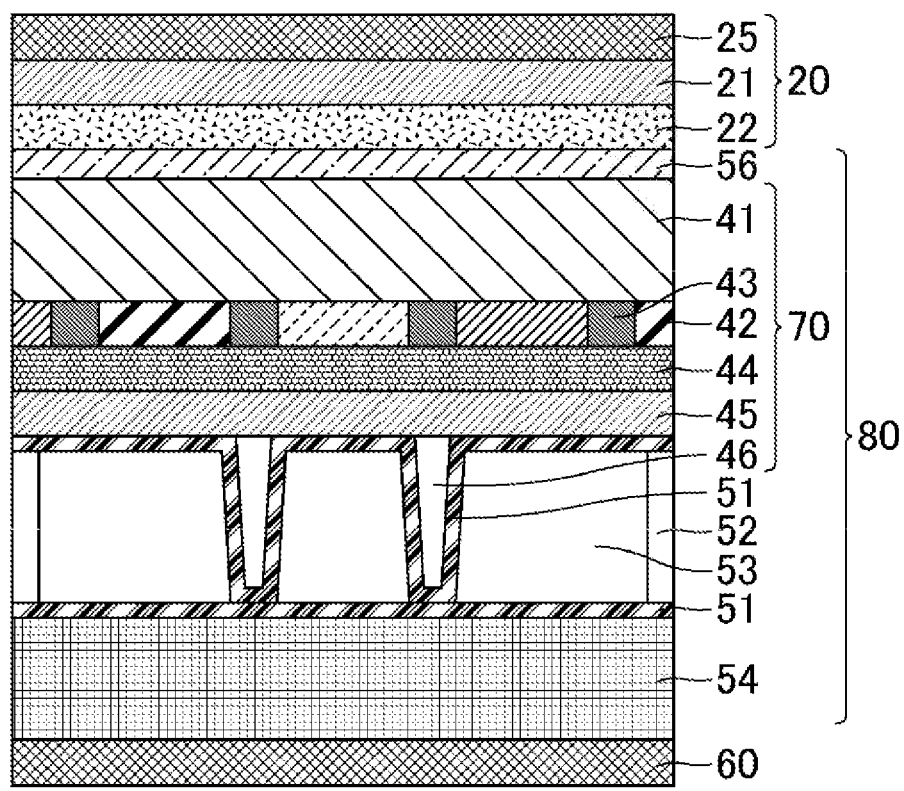
FIG. 5 is a schematic cross-sectional view showing the structure of a liquid crystal display device of Example 4.

FIG. 5 is a schematic cross-sectional view showing the structure of a liquid crystal display device of Example 4. Hereinafter, the method for producing the liquid crystal display device of Example 4 is described with reference to FIG. 5. Herein, in a liquid crystal panel with an in-cell retardation layer, the back surface side of the glass substrate 41 is referred to as "in-cell" and the viewing surface side of the glass substrate 41 is referred to as "out-cell".

(1) Production of Liquid Crystal Panel (LCD) with in-Cell Retardation Layer

On the over coat (OC) layer 44 of the CF substrate, which was formed in the same manner as in Example 3, a coating λ/4 retardation layer 45 having reverse wavelength dispersibility was formed as an in-cell retardation layer in the same manner as in Example 1. The coating λ/4 retardation layer 45 had undergone alignment treatment so as to have a slow axis at an azimuth of 135°. Then, the photo spacers (PSs) 46 having a height of 3.3 μm were formed thereon from resist (photosensitive resin), so that the liquid crystal layer 53 had a thickness of 3.3 μM. Thereby, a color filter (CF) substrate 70 with an in-cell retardation layer was obtained.

In the same manner as in Example 3, application of an alignment film, rubbing treatment, bonding of the substrates, injection of liquid crystal, and slimming treatment were performed, whereby a LCD panel 80 with an in-cell retardation layer was obtained.

(2) Stacking of Retardation Layer and Polarizing Film

On the viewing surface side of the liquid crystal panel 80 with an in-cell retardation layer were directly stacked the coating positive C plate 22, the coating λ/4 retardation layer 21, and the coating polarizing layer 25 in the stated order in the same manner as in Example 2. Differently from Example 2, the rubbing azimuth of the alignment film on the coating λ/4 retardation layer 21 was 45°, and the rubbing azimuth of the alignment film on the coating polarizing layer 25 was 90°. Thus, on the viewing surface side of the liquid crystal panel 80 was disposed the circularly polarizing plate 20 that was a laminate including the coating positive C plate 22, the coating λ/4 retardation layer 21, and the coating polarizing layer 25. On the back surface side of the liquid crystal panel 80 was directly stacked the coating polarizing layer 60 in the same manner as in Example 1. The rubbing azimuth of the alignment film of the coating polarizing layer 60 was 0°.

On the back surface side of the coating polarizing layer 60 was stacked a brightness enhancement film "APF-V3" (from 3M Japan Ltd.) using an adhesive layer "PD-S1" (from Panac Co., Ltd.). Finally, a backlight was disposed on the back surface side of the liquid crystal panel 80. Thereby, the liquid crystal display device of Example 4 was obtained.

Comparative Example 1

Figure 6:
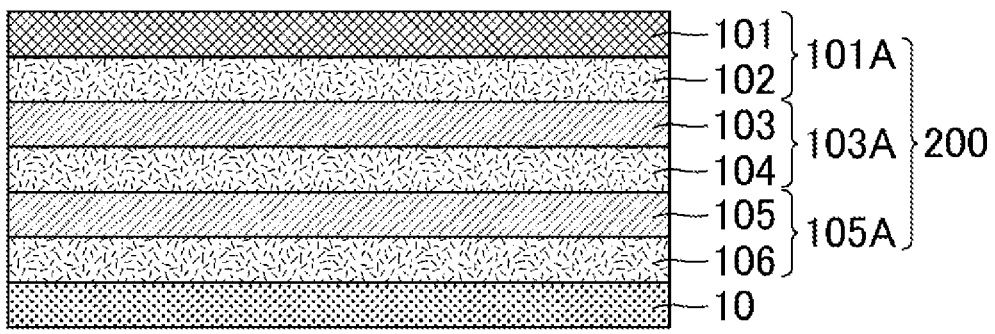
FIG. 6 is a schematic cross-sectional view showing the structure of a circularly polarizing plate included in an organic electroluminescent display device of Comparative Example 1.

FIG. 6 is a schematic cross-sectional view showing the structure of a circularly polarizing plate included in an organic electroluminescent display device of Comparative Example 1. Hereinafter, the method for producing the organic electroluminescent display device of Comparative Example 1 is described with reference to FIG. 6.

(1) Production of Circularly Polarizing Plate

A polarizing plate 101A with an adhesive layer, a λ/2 plate 103A with an adhesive layer having an in-plane retardation (Re) of 270 nm, and a λ/4 plate 105A with an adhesive layer having an in-plane retardation (Re) of 140 nm were bonded to one another in the stated order, whereby a circularly polarizing plate 200 was produced. The polarizing plate 101A with an adhesive layer was a commercially available polarizing plate "CVT 1764 FCUHC" (from Nitto Denko Corporation). The polarizing plate 101A with an adhesive layer included an adhesive layer 102 and a polarizing plate 101 including a polyvinyl alcohol (PVA) polarizer sandwiched between a pair of protective films. The λ/2 plate 103A with an adhesive layer was a commercially available Zeonor film "NZF" (from Nitto Denko Corporation). The λ/2 plate 103A with an adhesive layer included an adhesive layer 104 and a λ/2 retardation layer 103 formed from cycloolefin polymer (COP) resin. The λ/4 plate 105A with an adhesive layer was a commercially available Zeonor film "NZF" (from Nitto Denko Corporation). The λ/4 plate 105A with an adhesive layer included an adhesive layer 106 and a λ/4 retardation layer 105 formed from cycloolefin polymer (COP) resin. The polarizing plate 101 had an axis angle of 45°, the λ/2 retardation layer 103 had an axis angle of 60°, and the λ/4 retardation layer 105 had an axis angle of 120°. The resulting circularly polarizing plate 200 had a thickness of 240 μm.

(2) Production of Organic Electroluminescent Panel with Polarizing Plate

The organic electroluminescent panel 10 produced in the same manner as in Example 1 and the circularly polarizing plate 200 of Comparative Example 1 were bonded together. Finally, the workpiece was irradiated with laser light from the glass substrate side, so that the adhesion between the Mo film and the polyimide layer was reduced. The glass substrate and the Mo film were then separated from the other members of the organic electroluminescent panel 10, whereby the organic electroluminescent panel with a polarizing plate of Comparative Example 1 was produced.

Comparative Example 2

Figure 7:
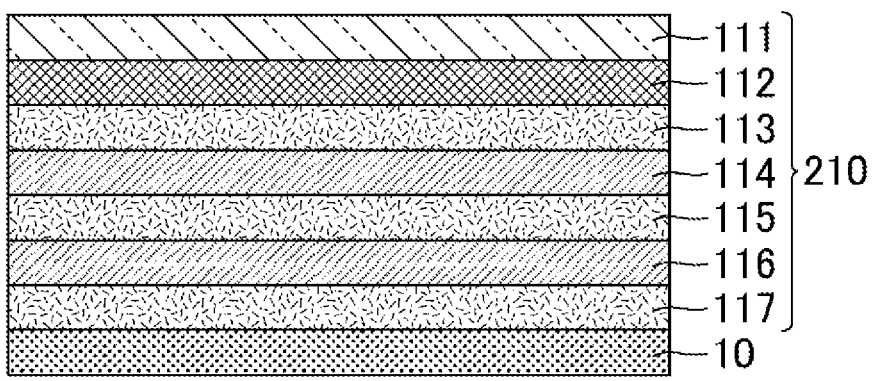
FIG. 7 is a schematic cross-sectional view showing the structure of a circularly polarizing plate included in an organic electroluminescent display device of Comparative Example 2.

FIG. 7 is a schematic cross-sectional view showing the structure of a circularly polarizing plate included in an organic electroluminescent display device of Comparative Example 2. Hereinafter, a method for producing the organic electroluminescent display device of Comparative Example 2 is described with reference to FIG. 7.
(1) Production of Circularly Polarizing Plate
[Production of Single TAC Polarizing Plate]
A retardation film was separated from a commercially available circularly polarizing plate "NZD-CVEQ" (from Nitto Denko Corporation), whereby a single TAC polarizing plate was obtained in which a TAC film 111 and a polarizer 112 formed from PVA were stacked.
[Production of λ/4 Retardation Layer and λ/2 Retardation Layer]
An alignment film solution prepared in the same manner as in Example 1 was applied to a PET film by flexographic printing, dried for one minute in an oven at 80° C., and irradiated with UV light to be cured, whereby an alignment film was formed. The alignment film was rubbed and thereby underwent alignment treatment.
To the alignment film undergone alignment treatment, a polymerizable liquid crystal solution "RMS03-013" (from Merck) was applied by slit coating. The workpiece was dried for one minute in an oven at 120° C. and irradiated with UV light to be cured, whereby a λ/2 retardation layer 114 and a λ/4 retardation layer 116 were produced. The λ/2 retardation layer 114 had a thickness of 2.2 μm, and the λ/4 retardation layer 116 had a thickness of 1.1 μm.
[Production of Circularly Polarizing Plate]
The prepared members were transferred and stacked in the order of the single TAC polarizing plate, the λ/2 retardation layer 114, and the λ/4 retardation layer 116, with the adhesive layers 113 and 115 in between. Then, an adhesive layer 117 was bonded thereto, whereby a circularly polarizing plate 210 was produced. The adhesive layers 113, 115, and 117 each were "PD-S1" (from Panac Co., Ltd.). The polarizer 112 had an axis angle of 45°, the λ/2 retardation layer 114 had an axis angle of 60°, and the λ/4 retardation layer 116 had an axis angle of 120°. The resulting circularly polarizing plate 210 had a thickness of 147 μm.
(2) Production of Organic Electroluminescent Panel with Polarizing Plate
The organic electroluminescent panel 10 produced in the same manner as in Example 1 and the circularly polarizing plate 210 of Comparative Example 2 were bonded together. Finally, the workpiece was irradiated with laser light from the glass substrate side, so that the adhesion between the Mo film and the polyimide layer was reduced. The glass substrate and the Mo film were then separated from the other members of the organic electroluminescent panel 10, whereby the organic electroluminescent panel with a polarizing plate of Comparative Example 2 was produced.

Comparative Example 3

Figure 8:
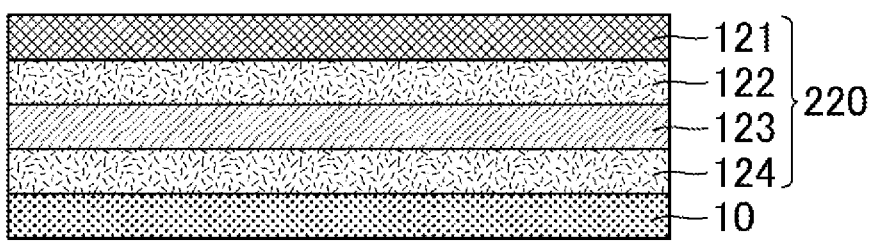
FIG. 8 is a schematic cross-sectional view showing the structure of a circularly polarizing plate included in an organic electroluminescent display device of Comparative Example 3.

FIG. 8 is a schematic cross-sectional view showing the structure of a circularly polarizing plate included in an organic electroluminescent display device of Comparative Example 3. Hereinafter, a method for producing the organic electroluminescent display device of Comparative Example 3 is described with reference to FIG. 8.
(1) Production of Circularly Polarizing Plate
A circularly polarizing plate was separated from a commercially available organic electroluminescent panel "GalaxyS7" (from Samsung Electronics Co., Ltd.) and was used as a circularly polarizing plate 220 of Comparative Example 3. The circularly polarizing plate 220 was found through an analysis to be a laminate including: a polarizing plate 121 including a PVA polarizer sandwiched between a pair of protective films, an adhesive layer 122, a λ/4 retardation layer 123 having reverse wavelength dispersibility, and an adhesive layer 124. The circularly polarizing plate 220 had a thickness of 143 μm.
(2) Production of Organic Electroluminescent Panel with Polarizing Plate
The organic electroluminescent panel 10 produced in the same manner as in Example 1 and the circularly polarizing plate 220 of Comparative Example 3 were bonded together. Finally, the workpiece was irradiated with laser light from the glass substrate side, so that the adhesion between the Mo film and the polyimide layer was reduced. The glass substrate and the Mo film were then separated from the other members of the organic electroluminescent panel 10, whereby the organic electroluminescent panel with a polarizing plate of Comparative Example 3 was produced.

Comparative Example 4

Figure 9:
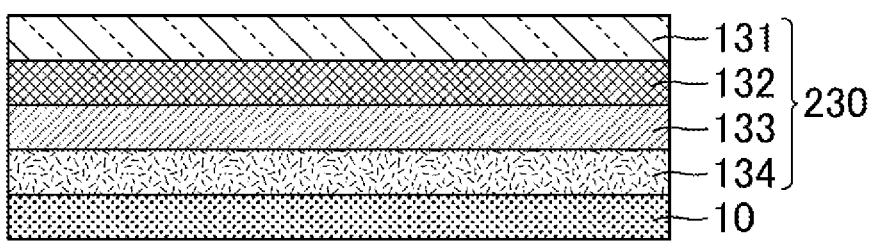
FIG. 9 is a schematic cross-sectional view showing the structure of a circularly polarizing plate included in an organic electroluminescent display device of Comparative Example 4.

FIG. 9 is a schematic cross-sectional view showing the structure of a circularly polarizing plate included in an organic electroluminescent display device of Comparative Example 4. Hereinafter, a method for producing the organic electroluminescent display device of Comparative Example 4 is described with reference to FIG. 9.
(1) Production of Circularly Polarizing Plate
A coating polarizing layer 132 was formed on a TAC film 131 in the same manner as in Example 1. On the coating polarizing layer 132 was formed a coating λ/4 retardation layer 133 having reverse wavelength dispersibility in the same manner as in Example 1. Finally, an adhesive layer 134 was bonded thereto, whereby a circularly polarizing plate 230 of Comparative Example 4 was produced. The adhesive layer 134 was "PD-S1" (from Panac Co., Ltd.). The resulting circularly polarizing plate 230 had a thickness of 70 μm.
(2) Production of Organic Electroluminescent Panel with Polarizing Plate
The organic electroluminescent panel 10 produced in the same manner as in Example 1 and the circularly polarizing plate 230 of Comparative Example 4 were bonded together using the adhesive layer 134. Finally, the workpiece was irradiated with laser light from the glass substrate side, so that the adhesion between the Mo film and the polyimide layer was reduced. The glass substrate and the Mo film were then separated from the other members of the organic electroluminescent panel 10, whereby the organic electroluminescent panel with a polarizing plate of Comparative Example 4 was produced.

Comparative Example 5

Figure 10:
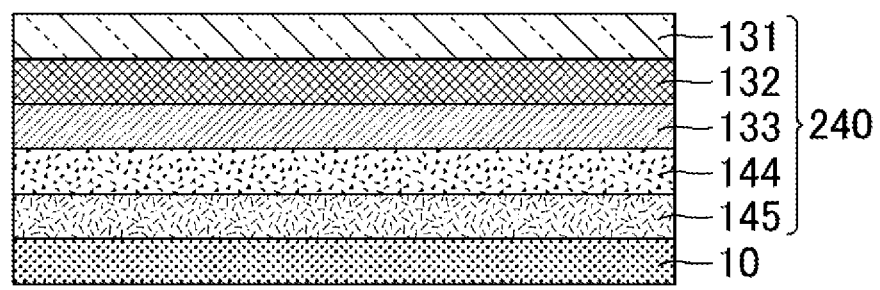
FIG. 10 is a schematic cross-sectional view showing the structure of a circularly polarizing plate included in an organic electroluminescent display device of Comparative Example 5.

FIG. 10 is a schematic cross-sectional view showing the structure of a circularly polarizing plate included in an organic electroluminescent display device of Comparative Example 5. Hereinafter, a method for producing the organic electroluminescent display device of Comparative Example 5 is described with reference to FIG. 10.

(1) Production of Circularly Polarizing Plate

A coating positive C plate 144 was formed on the λ/4 retardation layer 133 of the circularly polarizing plate 230 produced in Comparative Example 4 in the same manner as in Example 1. Finally, an adhesive layer 145 was bonded thereto, whereby a circularly polarizing plate 240 of Comparative Example 5 was produced. The adhesive layer 145 was "PD-S1" (from Panac Co., Ltd.). The resulting circularly polarizing plate 240 had a thickness of 74 μm.

(2) Production of Organic Electroluminescent Panel with Polarizing Plate

The organic electroluminescent panel 10 produced in the same manner as in Example 1and the circularly polarizing plate 240 of Comparative Example 5 were bonded together using the adhesive layer 145. Finally, the workpiece was irradiated with laser light from the glass substrate side, so that the adhesion between the Mo film and the polyimide layer was reduced. The glass substrate and the Mo film were then separated from the other members of the organic electroluminescent panel 10, whereby the organic electroluminescent panel with a polarizing plate of Comparative Example 5 was produced.

<Evaluation Test>

The following evaluation tests were conducted for each of the display devices produced in Examples 1 to 4 and Comparative Examples 1 to 5. Table 1 shows the results.

Bending (folding) test: A pole was fitted the centers of the longer sides of the resulting organic electroluminescent panel and the panel was repeatedly folded along the pole (R=5 mm) 5000 times. After the test, the panel was examined for troubles such as breakage of the protective film inside the panel, breakage of the polarizing layer, and white turbidity of the adhesive layer.

Moisture resistance test: The panel was stored in an environment at 60° C. and 90% RH for 1000 hours. The panel was then powered on and examined for troubles of display state.

Reflective viewing angle test: In a bright room environment at 5000 lux, five subjects observed the panel at a polar angle of 50° and evaluated if the panel displays well or not. The criteria of the reflective viewing angle were determined by the number of subjects who evaluated the display state as good: the case with the number thereof of 2 or less was determined as poor; the case with the number thereof of 3 or 4 was determined as good; and the case with the number thereof of 5 was evaluated as excellent.

As shown in Table 1, each of the display devices of Examples 1 to 4 achieved a thin profile: the thickness of the polarizing plate on the viewing surface side was 9 μm or smaller. The display devices of Examples 1 and 2 achieved better results in all of the bending test, moisture resistance test, and reflective viewing angle test. Since the display devices of Examples 3 and 4 both included a liquid crystal panel including a glass substrate, the bending test was skipped. They achieved good results in the moisture resistance test and reflective viewing angle test. In contrast, the display devices of Comparative Examples 1 to 5 each failed to have a thin profile: the thickness of the polarizing plate on the viewing surface side was 70 μm or greater. The display devices of Comparative Examples 1 to 5, each including an adhesive layer, had troubles such as white turbidity of the adhesive layer in the bending test and had uneven luminance in the moisture resistance test. In the display devices of Comparative Examples 4 and 5, the retardation layer and the polarizer were formed by coating. Thus, the thickness of the polarizing plate on the viewing surface side was smaller than those of the display devices of Comparative Examples 1 to 3, resulting in no breakage of the polarizing layer in the bending test.

[Additional Remarks]

An aspect of the present invention is a display device including a display panel, a retardation layer, and a polarizer which are stacked in the stated order from a back surface side to a viewing surface side and integrated without an adhesive layer. The retardation layer and the polarizer preferably each contain a cured product of polymerizable liquid crystal. A combination of the retardation layer and the polarizer preferably functions as a circularly polarizing plate. The display panel may be an organic electroluminescent panel or a liquid crystal panel. The display device of the present invention may further include a touch screen sensor disposed closer to a back surface than the retardation layer is.

Another aspect of the present invention is a method for producing a display device including: forming a first alignment film on a display panel, applying a solution containing first polymerizable liquid crystal to the first alignment film, and curing the first polymerizable liquid crystal to produce a retardation layer; and forming a second alignment film on the retardation layer, applying a solution containing second polymerizable liquid crystal and a dichroic material to the second alignment film, and curing the second polymerizable liquid crystal to produce a polarizer.

REFERENCE SIGNS LIST

10: Organic electroluminescent panel (display panel)
11: Glass substrate

TABLE 1

| | | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|---|
| Type of panel | | OLED | OLED | LCD | LCD | OLED | OLED | OLED | OLED | OLED |
| Thickness of polarizing plate on viewing surface side (μm) | | 5 | 8 | 9 | 9 | 240 | 147 | 143 | 70 | 74 |
| Bending test | Breakage of protective film | Absent | Absent | No test performed | No test performed | Present | Present | Present | Present | Present |
| | Breakage of polarizing layer | Absent | Absent | | | Present | Present | Present | Absent | Absent |
| | White turbidity of adhesive layer | Absent | Absent | | | Present | Present | Present | Present | Present |
| Moisture resistance text | | No trouble | No trouble | No trouble | No trouble | Uneven luminance | Uneven luminance | Uneven luminance | Uneven luminance | Uneven luminance |
| Reflective viewing angle text | | Good | Excellent | Not performed | Excellent | Poor | Poor | Good | Good | Excellent |

12: Molybdenum (Mo) film
13: Polyimide film
14: Protective film
15: TFT layer
16: Organic electroluminescent layer 17: Sealing film
20: Circularly polarizing plate
21: Coating λ/4 retardation layer
22: Coating positive C plate
25: Coating polarizing layer
30: Linearly polarizing plate
40: Color filter (CF) substrate
41: Glass substrate
42: Color filter (CF) layer
43: Black matrix (BM)
44: Over coat (OC) layer
45: Coating λ/4 retardation layer
46: Photo spacer (PS)
50: Liquid crystal panel
51: Alignment film
52: Seal
53: Liquid crystal layer
54: TFT substrate
56: ITO thin film
60: Coating polarizing layer
70: Color filter (CF) substrate with in-cell retardation layer
80: Liquid crystal panel with in-cell retardation layer
101: Polarizing plate
101A: Polarizing plate with adhesive layer
102, 104, 106, 113, 115, 117, 122, 124, 134, 145: Adhesive layer
103, 114: λ/2 retardation layer
103A: λ/2 plate with adhesive layer
105, 116, 123: λ/4 retardation layer
105A: λ/4 plate with adhesive layer
111, 131: TAC film
112: Polarizer
121: Polarizing plate
132: Coating polarizing layer
133: Coating λ/4 retardation layer
144: Coating positive C plate
200, 210, 220, 230, 240: Circularly polarizing plate

The invention claimed is:

1. A foldable display device comprising:
a display panel,
a retardation layer, and
a polarizer, wherein
the display panel includes a sealing film,
the retardation layer includes a first alignment film on the sealing film, and a first cured product of a first polymerizable liquid crystal on the first alignment film,
the polarizer includes a second alignment film on the first cured product, and a second cured product of a second polymerizable liquid crystal on the second alignment film,
the second polymerizable liquid crystal contains a polarizing dichroic material, and
the display panel, the retardation layer, and the polarizer are integrated without an adhesive layer.

2. The foldable display device according to claim 1, wherein a combination of the retardation layer and the polarizer functions as a circularly polarizing plate.

3. The foldable display device according to claim 1, wherein the display panel is an organic electroluminescent panel.

4. The foldable display device according to claim 1, wherein the display panel is a liquid crystal panel.

5. The foldable display device according to claim 1, wherein the foldable display device further includes a touch screen sensor disposed closer to a back surface of the foldable display device than the retardation layer.

6. The foldable display device according to claim 1, wherein an alignment azimuth of the retardation layer is substantially orthogonal to an alignment treatment azimuth of the polarizer.

7. The foldable display device according to claim 1, wherein an alignment azimuth of the retardation layer forms an angle of about 45 degrees with an alignment azimuth of the polarizer.

8. The foldable display device according to claim 1, further comprising a positive C plate arranged on the display panel.

9. The foldable display device according to claim 8, wherein the positive C plate includes a vertical alignment film and a layer made of a polymerizable liquid crystal.

10. The foldable display device according to claim 1, wherein the retardation layer is a λ/4 plate.

11. The foldable display device according to claim 1, wherein a laminate of the retardation layer and the polarizer is a circularly polarizing plate having a thickness of 9 μm or less.

12. The foldable display device according to claim 1, further comprising a folded portion along a line connecting between center points of longer sides of the display panel.

13. The foldable display device according to claim 1, wherein the display panel includes a support substrate of a polyimide film.

14. A method for producing a display device comprising:
forming a first alignment film on a liquid crystal panel or a sealing film of a display panel, applying a solution containing first polymerizable liquid crystal to the first alignment film, and curing the first polymerizable liquid crystal to produce a retardation layer; and
forming a second alignment film on the retardation layer, applying a solution containing second polymerizable liquid crystal and a dichroic material to the second alignment film, and curing the second polymerizable liquid crystal to produce a polarizer.

* * * * *